United States Patent [19]

Carter

[11] 4,107,553
[45] Aug. 15, 1978

[54] TIMER CONTROL CIRCUIT

[75] Inventor: Robert A. Carter, Asheboro, N.C.

[73] Assignee: General Electric Company, Bridgeport, Conn.

[21] Appl. No.: 790,294

[22] Filed: Apr. 25, 1977

[51] Int. Cl.² .......................................... H03K 17/30
[52] U.S. Cl. .................................... 307/293; 307/246
[58] Field of Search ...................... 307/293, 294, 246

[56] References Cited

U.S. PATENT DOCUMENTS

| 3,480,801 | 11/1969 | Smith | 307/293 |
|---|---|---|---|
| 3,732,467 | 5/1973 | Mills | 307/293 |
| 3,814,954 | 6/1974 | Cake | 307/293 |
| 4,015,145 | 3/1977 | Stewart | 307/293 |

Primary Examiner—John S. Heyman
Attorney, Agent, or Firm—Carlos Nieves; George R. Powers; John F. Cullen

[57] ABSTRACT

A timer control circuit for controlling the ON-OFF operation of a controllable current conducting device, such as an indicator lamp or a semiconductor power device, and for keeping the device in a given operating state over a readily adjustable time interval, that utilizes relatively few components and is of low cost construction. The circuit includes principally resistive-capacitive timing means and transistor switching means, the device being coupled with the transistor switching means which, in addition to selectively connecting the device in and out of the circuit as a function of the timing cycle, feeds back a threshold voltage to the timing means as an integral parameter in determining the time interval.

10 Claims, 3 Drawing Figures

TIMER CONTROL CIRCUIT

BACKGROUND OF THE INVENTION

The invention pertains to timer circuits of the type that control certain switching functions, and in particular that switch relatively low level currents, on the order of milliamperes, such as required for turning an indicator lamp or an SCR device ON and OFF at prescribed time intervals. Many forms of circuits exist which perform this function, but in most instances they are of relatively complex design and have commensurately high costs of fabrication. It is particularly common to employ relatively expensive monolithic timing circuits to provide the essential timing functions, which circuits are connected to discrete components as required for performing the overall control operation.

SUMMARY OF THE INVENTION

It is accordingly an object of the invention to provide a novel timer control circuit useful for switching relatively low level currents, such as to operate an indicator lamp or an SCR device, that is of relatively simple circuit configuration and inexpensive circuit construction.

It is a further object of the invention to provide a timer control circuit that is readily adjustable for controlling the timing operation thereof.

A further object of the invention is to provide a timer control circuit as described above that is of a non-latching circuit configuration.

It is another object of the invention to provide a timer control circuit that permits utilization of a relatively small and inexpensive timing capacitor.

Still a further object of the invention is to provide a timer control circuit that exhibits a compensated timing threshold for ensuring timing accuracy in the presence of voltage supply instability.

These and other objects of the invention are accomplished in accordance with one aspect thereof, by a timer control circuit for controlling the ON-OFF operation of a controllable device that utilizes relatively low level currents, such as an indicator lamp or an SCR device, which includes a resistive-capacitive timing means having a timing capacitor and a parallel coupled variable resistance that together are connected in series with a manually operated switch for initiating a timing cycle having an adjustable time interval. The circuit further includes transistor switching means the input of which is controlled by said capacitive timing means and the output of which is coupled in parallel with said controllable device for switching said device in and out of the circuit in accordance with said timing cycle. A threshold voltage is developed at the output of said transistor switching means which feeds the threshold voltage back to the capacitive timing means. During normal operation, the timing capacitor is substantially discharged and current is supplied through the variable-resistance to said transistor switching means for causing it to conduct and to turn the device OFF. Upon momentary actuation of the manual switch the timing cycle commences, at which time said timing capacitor rapidly charges, cutting off said transistor switching means and turning the device ON. The timing capacitor gradually discharges through said variable resistance which action in combination with said threshold voltage determines the time when the transistor switching means again conducts and the device turns OFF.

In accordance with a further aspect of the invention, the timing capacitor is coupled in series with the variable resistance and in parallel with the manual switch so as to be normally substantially charged and become rapidly discharged upon initiation of the timing cycle.

In accordance with yet another aspect of the invention, the output of the transistor switching means is connected in series with said indicator lamp whereby the lamp is normally ON and is turned OFF during said time interval.

BRIEF DESCRIPTION OF THE DRAWING

While the specification concludes with the claims which particularly point out and distinctly define that subject matter which is regarded as the invention, it is believed the invention will be more clearly understood when considering the following detailed description and the accompanying figures of the drawing in which:

DESCRIPTION OF THE PREFERRED EMBODIMENT

Figure 1:
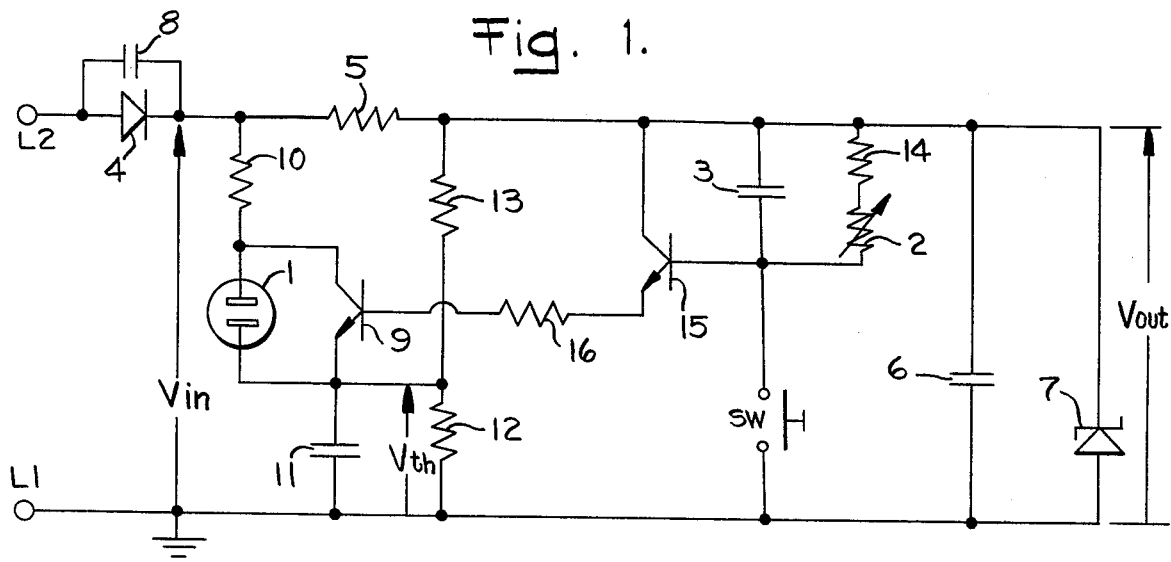
FIG. 1 is a schematic circuit diagram, in accordance with one embodiment of the invention, of a timer control circuit for controlling the ON-OFF operation of an indicator lamp over a readily adjustable time interval.

With reference to FIG. 1 of the drawing, there is illustrated a schematic circuit diagram of one embodiment of a timer control circuit which controls the ON-OFF operation of a low level current device 1, which in the illustrated circuit is a neon indicator lamp. The indicator lamp is normally OFF and upon being switched ON may be maintained in this condition for a moderately lengthy time interval, on the order of 5 to 60 seconds, which is readily adjustable through the setting of a variable resistor 2. The circuit is of relatively simple and inexpensive construction and, in particular, is capable of providing the appropriate timing cycle through use of a small and inexpensive timing capacitor 3.

The circuit may have power supplied from a conventional 110 volt, 60 cycle AC line at terminals L1 and L2, L2 being illustrated as the high voltage side of the line and L1 being illustrated at ground for ease of explanation. A diode 4, having its anode tied to terminal L2, is connected in series with a voltage dropping resistor 5 and a capacitor 6 to ground for providing a high level rectified voltage (Vin) at the input side of resistor 5 and a low level DC voltage (Vout) at the output side of this resistor. A zener diode 7 is connected in parallel with capacitor 6, with its anode at ground, for maintaining the low level DC voltage Vout at a relatively constant value. A bypass capacitor 8, connected in parallel with diode 4, protects the diode from transients occurring on the AC power line.

The indicator lamp 1, which is a relatively high voltage device capable of operating at the 110 volt line voltage, is connected in parallel with the collector-emitter circuit of a first NPN transistor 9, which functions to turn the lamp ON and OFF. One terminal of the lamp is connected directly to the collector of transistor 9 and through a current limiting resistor 10 to the high voltage (Vin) side of resistor 5. The other terminal of lamp 1 is connected directly to the emitter of transistor 9 and through the parallel combination of a capacitor 11 and a resistor 12 to ground. Resistor 12 is also serially connected with a resistor 13 to the low voltage (Vout) side of resistor 5. Resistors 12 and 13 function as a voltage divider to establish a threshold voltage Vth at the emitter of transistor 9, which together with the functioning of the timing circuit operate to control the timing cycle, as will be further described.

The timing circuit includes the timing capacitor 3 which is coupled in parallel with the serial connection of variable resistor 2 and a further current limiting resistor 14 which provide a closed current path around said capacitor, the parallel resistor-capacitor combination being connected from the low voltage side of resistor 5 through a switch SW to ground. Switch SW may be a simple leaf switch or other known form of manually operative switch for briefly providing a conduction path from the junction of capacitor 3 and variable resistor 2 to ground, momentary closing of the switch thereby acting to initiate a timing cycle. The junction of capacitor 3 and resistor 2 is further connected to the base of a second NPN transistor 15, the collector of which is coupled to the low voltage side of resistor 5 and the emitter coupled through a current limiting resistor 16 to the base of transistor 9. Transistors 9 and 15, which comprise the transistor switching means of the timer control circuit, are connected in a current gain relationship. Transistor 9 is of a relatively high voltage rating to satisfy the high voltage requirements imposed upon it due to its connection in the high voltage side of the circuit. Transistor 15 is of a relatively high current gain rating so as to permit relatively long time intervals to be established by the timing circuit.

In one exemplary embodiment of applicant's invention as described with respect to FIG. 1, the following component types and component values were employed, which are given by way of example and not to be construed as limiting of the invention:

Transistors
9: Fairchild MPS5551M
15: Matsushita C1328
Diode
4: Silicon diode, GI 1N4005
7: Zener diode, 15 V
Capacitors
3: 68 uf
6, 11: 100 uf
8: 0.01 uf
Resistors
2: Potentiometer, 680 K $\Omega$
5: 10 K $\Omega$
10: 27 K $\Omega$
12: 3.9 K $\Omega$
13: 4.7 K $\Omega$
14: 82 K $\Omega$
16: 5.6 K $\Omega$
Lamp
1: Neon glow lamp, GES2A Referring to the operation of the circuit of FIG. 1, under normal operating conditions with the switch SW open, timing capacitor 3 is substantially discharged. Base current for transistor 15 is supplied through resistors 2 and 14 for holding the transistor in its conductive state. Its emitter current flows through resistor 16 and into the base of transistor 9 for holding this transistor conducting. Wtih transistor 9 conducting a low voltage is established across indicator lamp 1 for keeping the lamp OFF. During this portion of the operation the high voltage (Vin) at the input of resistor 5 is substantially across the resistor 10. A timing cycle is initiated by momentarily bridging the contacts of the switch SW which causes the timing capacitor to charge essentially instantaneously to the low voltage (Vout), which biases transistor 15 to cut-off. This in turn causes transistor 9 to stop conducting. The high voltage (Vin) is thereby applied across the indicator lamp 1 with sufficient magnitude for turning the lamp ON.

With the capacitor 3 charged and the transistor 15 biased to be non-conducting, the capacitor discharges through the discharge path of resistors 2 and 14, which gradually increases the voltage at the base of transistor 15. During this portion of the operation, the threshold voltage Vth is established at the emitter of the switching transistor 9 across resistor 12 and capacitor 11, which voltage is determined by the value of the low voltage (Vout) and that of resistors 12 and 13, and to a lesser extent by the current conduction through lamp 1. This threshold voltage is fed back as V$thb$ through the base-emitter circuits of the transistors 9 and 15 to the timing circuit, where V$thb$ = V$th$ + 2 V$eb$, with V$eb$ being the emitter to base voltage drop of the transistors. Upon the timing capacitor 3 discharging to a value where the voltage at the base of transistor 15 exceeds the feedback threshold voltage V$thb$, transistors 15 and 9 again conduct. This turns the indicator lamp OFF and the timing cycle is ended, to be initiated anew upon subsequent closing of the switch SW. It is important that capacitor 11 hold V$th$ steady at the end of the timing cycle in order to avoid flickering of the lamp.

The time interval of the timing cycle is therefore determined by the RC discharge time constant for timing capacitor 3 and resistors 2 and 14 in combination with the threshold voltage V$th$ established at the emitter of transistor 9. This time interval is readily adjusted by setting the value of variable resistor 2. As noted in the exemplary working embodiment of the circuit, the variable resistor 2 may be a common potentiometer which, in the example given, is adjustable to provide a total discharge resistance from a value of about 80 to 760 K $\Omega$, providing a time interval of about 5 to 60 seconds. In addition to the setting of variable resistor 2 providing a readily adjustable and relatively precise timing cycle, the circuit configuration provides a compensated timing threshold. Thus, should Vout tend to change due to component tolerances or drift, the voltage threshold will follow such voltage change so that the timing cycle remains substantially constant.

A principal feature of the present circuit which significantly contributes to its simplicity and cost effectiveness is the utilization of the switching portion of the circuit to develop a threshold voltage which is fed back through the transistor switching means to the timing circuit, this portion of the circuit thus providing the dual function of switching the indicator lamp ON and OFF and applying the threshold voltage used in the timing operation. Another important feature of the circuit is the utilization of the timing circuit to supply the current for operating the switching transistors 9 and 15 and for these transistors to provide sufficient current gain to perform the requisite switching function. Related to this is the desirability of employing a small, inexpensive timing capacitor which necessitates having a high impedance discharge path in order to obtain time delays of the referred to magnitude. Since the discharge path is also employed to supply input current to the switching transistors, this input current is necessarily extremely small.

A further significant feature of the circuit is that it is of a non-latching type, i.e. does not require separate trigger signals to change from one state to another. Being a non-latching circuit, it is not sensitive to spurious voltage spikes that may be present on the line and does not require isolating capacitors, which represent added cost, to protect against such spurious signals.

Another feature of the circuit is that it is capable of controlling the operation of a relatively high voltage device connected in the high voltage side of the circuit by means of an inexpensive timing circuit connected in the low voltage part of the circuit.

Figure 2:
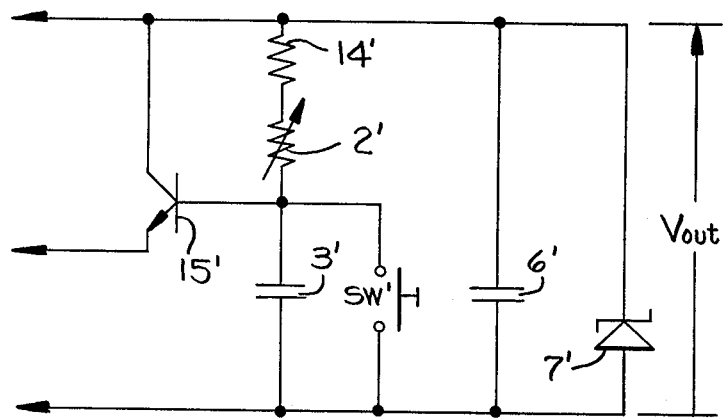
FIG. 2 is a schematic circuit diagram illustrating a modified circuit connection of the timing capacitor from that shown in FIG. 1.

In FIG. 2 is illustrated a modified embodiment of the circuit of FIG. 1 wherein the timing capacitor 3' is connected in parallel with the switch SW' and in series with the resistors 2' and 14'. To simplify the illustration, only the timing portion of the circuit is shown. The remainder of the circuit may be precisely as in FIGS. 1 or 3. In FIG. 2 the same reference characters are employed for corresponding components as in FIG. 1, but with an added prime notation. The modified connection of the capacitor 3' shown in FIG. 2 causes the capacitor to be normally charged to substantially the voltage Vout for providing conduction of the transistor 15'. By momentarily closing the switch SW', capacitor 3' is essentially instantaneously discharged, which cuts off the transistor 15'. The operation of the circuit is otherwise the same as that of the circuit of FIG. 1.

Figure 3:
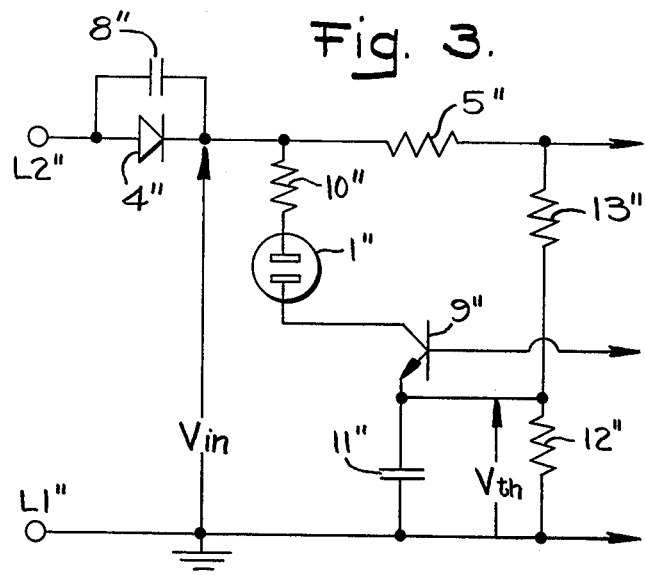
FIG. 3 is a schematic circuit diagram illustrating a modified circuit connection of the indicator lamp from that shown in FIG. 1.

With reference to FIG. 3, there is shown another modified embodiment of the circuit of FIG. 1 wherein the indicator lamp 1" is connected in series with the switching transistor 9" between its collector and the resistor 10". In FIG. 3 only the left hand switching portion of the circuit is shown with the same reference numerals used for corresponding components as in FIG. 1, but having an added double prime notation. The remainder of the circuit may be as in FIGS. 1 or 2. The operation of the circuit of FIG. 3 is similar to that of FIG. 1 except that it provides an inverse operation of the indicator lamp 1". Thus, the lamp is normally ON due to conduction of transistor 9". When the timing cycle is initiated and transistor 9" cuts off, the indicator lamp is turned OFF. It remains OFF until the end of the timing cycle when the transistor 9" once more conducts, which results in the application of sufficient voltage across the lamp to cause it to turn ON. The threshold voltage Vth in FIG. 3 is developed when neither lamp 1" nor transistor 9" is conducting and so is determined entirely by the value of resistors 12" and 13" and the voltage at the output side of resistor 5".

Although the invention has been described with regard to specific examples thereof for the purpose of clear disclosure, it should be appreciated that numerous circuit changes and modifications may be made to the present circuitry that would not exceed the basic teachings herein provided. Thus, the circuit can be employed to control low level currents other than as specifically described with respect to neon indicator lamps. For example, the circuit can be used in conjunction with semiconductor power devices that employ relatively low currents to switch high currents, such as SRC, triac and power transistor devices. More specifically, were the circuit of FIG. 1 employed with an SCR device in lieu of the indicator lamp 1, the anode and cathode terminals of the device might be connected in series with a load directly across terminals L1 and L2 and the device's gate electrode connected in series with a current limiting resistor and voltage protecting zener diode to the junction of resistor 10 and the collector of transistor 9. Operation would be as described with regard to FIG. 1, so that normally transistor 9 conducts and shunts current from the gate electrode, keeping the SCR turned OFF. At this time the zener diode is in its high impedance state. When transistor 9 is made non-conducting, the zener diode exceeds its breakdown voltage and current is supplied to the gate electrode for turning the SCR ON. In addition a single switching transistor could be employed in place of the two transistors disclosed providing its current gain characteristic B were sufficiently large to respond to the input currents supplied by the timing circuit and if consistent with the magnitude of time intervals required. Accordingly, the appended claims are intended to include within their scope all such changes and modifications.

What I claim as new and desire to secure by Letters Patent of the United States is:

1. A timer control circuit for controlling the ON-OFF operation of a controllable current conducting device, comprising:
   (a) capacitive timing means including variable resistance means that exhibits a timing cycle having an adjustable time interval,
   (b) circuit means for initiating said timing cycle,
   (c) transistor switching means having an input controlled by said capacitive timing means and having an output coupled to said controllable device for switching said device in and out of the circuit in accordance with said timing cycle, the switching means including first and second transistors connected in a current gain relationship with their base emitter circuits in series,
   (d) means for developing a threshold voltage, including a voltage divider resistance means, the first transistor having its emitter connected to an intermediate point on the voltage divider resistance means, and
   (e) means including said transistor switching means for feeding back said threshold voltage to said capacitive timing means, whereby said time interval is determined by said threshold voltage in combination with the setting of said variable resistance means.

2. A timer control circuit as in claim 1 wherein said capacitive timing means is coupled to the input of said transistor switching means and includes a timing capacitor connected to said variable resistance means in a closed current path, whereby prior to initiation of said timing cycle the voltage at the input of said transistor switching means exceeds said threshold voltage and current is supplied through said variable resistance means to said transistor switching means to cause conduction thereof, and upon initiation of said timing cycle the voltage at the input of said transistor switching means is reduced below said threshold voltage to cause said transistor switching means to stop conducting and current commences flowing through said closed path for gradually increasing the voltage at the input of said transistor switching means until it once again exceeds said threshold voltage.

3. A timer control circuit as in claim 2 wherein said circuit means includes a manual switch connected to said timing capacitor that is momentarily actuated so as to abruptly change the state of charge of said capacitor.

4. A timer control circuit as in claim 3 wherein said timer control circuit has a low voltage side and a high voltage side, said capacitor timing means is connected in said low voltage part and said controllable device is connected in said high voltage side.

5. A timer control circuit as in claim 4 wherein said first transistor has its output connected to said controllable device and said second transistor has its input connected to said capacitive timing means, said first transistor being of a relatively high voltage rating to satisfy the voltage requirements imposed upon it due to its connection in the high voltage side of the circuit and said second transistor being of a relatively high current gain rating so as to permit the adjustment of relatively long time intervals.

6. A timer control circuit as in claim 5, said first transistor having an emitter-collector circuit in which said controllable device is connected, and said second transistor having a base-collector circuit in which said capacitive timing means is connected.

7. A timer control circuit as in claim 6 wherein said controllable device is a lamp that is connected in parallel with said transistor switching means, whereby said lamp is normally turned OFF when said transistor switching means is conducting and is turned ON during said time interval when said transistor switching means is not conducting.

8. A timer control circuit as in claim 6 wherein said controllable device is a lamp that is connected in series with said transistor switching means, whereby said lamp is normally turned ON when said transistor switching means is conducting and is turned OFF during said time interval when said transistor switching means is not conducting.

9. A timer control circuit as in claim 6 wherein said timing capacitor is connected in parallel with said variable resistance and in series with said manual switch so that said timing capacitor is normally substantially discharged and becomes rapidly charged upon actuation of said manual switch.

10. A timer control circuit as in claim 6 wherein said timing capacitor is connected in series with said variable resistance and in parallel with said manual switch so that said timing capacitor is normally substantially charged and becomes rapidly discharged upon actuation of said manual switch.

* * * * *